United States Patent
Miyajima

(10) Patent No.: US 6,344,162 B1
(45) Date of Patent: Feb. 5, 2002

(54) METHOD OF MANUFACTURING SEMICONDUCTOR DEVICES AND RESIN MOLDING MACHINE

(75) Inventor: Fumio Miyajima, Togura-machi (JP)

(73) Assignee: Apic Yamada Corporation, Nagano (JP)

( * ) Notice: Subject to any disclaimer, the term of this patent is extended or adjusted under 35 U.S.C. 154(b) by 0 days.

(21) Appl. No.: 09/337,276

(22) Filed: Jun. 22, 1999

(30) Foreign Application Priority Data

Jul. 10, 1998 (JP) .......................................... 10-195723
Feb. 8, 1999 (JP) .......................................... 11-029469

(51) Int. Cl.[7] .......................... B29C 45/14; H01L 21/56
(52) U.S. Cl. ............................. 264/272.14; 264/272.15; 264/272.17; 264/316; 425/89; 425/121; 425/123; 425/127; 425/544
(58) Field of Search ....................... 264/272.14, 272.15, 264/272.17, 328.9, 316; 438/112; 425/116, 117, 121, 123, 127, 544, 89

(56) References Cited

U.S. PATENT DOCUMENTS

| 5,280,193 A | | 1/1994 | Lin et al. | |
|---|---|---|---|---|
| 5,371,044 A | * | 12/1994 | Yoshida et al. | ......... 264/272.17 |
| 5,776,798 A | * | 7/1998 | Quan et al. | ................. 438/112 |
| 5,932,254 A | * | 8/1999 | Mitchell et al. | ............. 425/117 |
| 5,997,798 A | * | 12/1999 | Tetreault et al. | ........ 264/272.14 |
| 6,173,490 B1 | * | 1/2001 | Lee et al. | ............... 264/272.14 |
| 6,187,243 B1 | * | 2/2001 | Miyajima | ..................... 425/89 |
| 6,200,121 B1 | * | 3/2001 | Tsuruta | ........................ 425/127 |

FOREIGN PATENT DOCUMENTS

| EP | 0665584 A1 | | 8/1995 | |
|---|---|---|---|---|
| EP | 0853337 A1 | | 7/1998 | |
| JP | 61167515 | | 7/1986 | |
| JP | 06151490 | | 5/1994 | |
| JP | 63-7638 A | * | 1/1998 | .............. 425/129.1 |
| JP | 10-34699 A | * | 2/1998 | |

* cited by examiner

Primary Examiner—Robert B. Davis
(74) Attorney, Agent, or Firm—Birch, Stewart, Kolasch & Birch, LLP

(57) ABSTRACT

The method of manufacturing semiconductor devices is capable of efficiently manufacturing semiconductor devices and preventing production of bad products. The method is executed in a molding machine including an tipper die and a lower die, in one of which a plurality of cavities corresponding to resin-molded parts of the semiconductor devices are formed. And, the method comprises the steps of: covering inner faces of the cavities and a parting face of one of the dies, which contacts a substrate of the semiconductor devices, with release film, which is easily peelable from the dies and resin for molding; clamping the substrate with the dies; filling the resin in the cavities; and forming the semiconductor devices by cutting the molded substrate.

13 Claims, 12 Drawing Sheets

METHOD OF MANUFACTURING SEMICONDUCTOR DEVICES AND RESIN MOLDING MACHINE

BACKGROUND OF THE INVENTION

The present invention relates to a method of manufacturing semiconductor devices and a resin molding machine for said method.

A conventional method of manufacturing semiconductor devices will be explained with reference to FIG. 24. A plurality of semiconductor chips 10 are matrically arranged on a substrate 12 at regular separations. The substrate 12 is molded with resin 14. After the resin 14 is solidified, the semiconductor chips 10 are respectively separated by cutting the resin 14 and the substrate 12 with a dicing cutter or a laser means, so that pieces of the semiconductor devices can be manufactured.

In the conventional method, a large number of semiconductor chips 10 can be arranged in the substrate 12 with high density, so that small semiconductor devices can be efficiently manufactured and manufacturing cost can be effectively reduced.

However, the conventional method, in which one side face of the substrate 12, on which the semiconductor devices 10 are arranged, is molded and the substrate 12 is cut to form the pieces of the semiconductor devices, has following disadvantages. In the case of cutting the substrate 12 with the dicing cutter, a dicing blade of the dicing cutter is apt to be damaged because the dicing blade cuts different materials, i.e., the substrate 12 and the solidified resin 14. Further, edges of the pieces of the semiconductor devices are apt to be broken and cracked. On the other hand, in the case of cutting with the laser means, it takes a long time to cut the substrate 12.

If the semiconductor chips 10 are molded by potting resin 14, it takes a long time to solidify the resin 14, so manufacturing efficiency is quite low. In the case of molding a transfer molding machine, wires are apt to be deformed by resin flow, so that bad products will be produced. Further, the molded substrate will be deformed or curved because one side face of the substrate 12 is wholly molded.

SUMMARY OF THE INVENTION

The present invention has been invented to solve the disadvantages of the conventional methods.

An object of the present invention is to provide a method of manufacturing semiconductor devices, which is capable of efficiently manufacturing semiconductor devices and preventing production of bad products.

Another object of the present invention is to provide a resin molding machine for executing the method.

To achieve the objects, the present invention has following basic structures.

The method of manufacturing semiconductor devices in a molding machine including an upper die and a lower die, in one of which a plurality of cavities corresponding to resin-molded parts of the semiconductor devices are formed, comprises the steps of:
  covering inner faces of the cavities and a parting face of one of the dies, which contacts a substrate of the semiconductor devices, with release film, which is easily peelable from the dies and resin for molding;
  clamping the substrate with the dies;
  filling the resin in the cavities; and
  forming the semiconductor devices by cutting the molded substrate.

And, the method of manufacturing semiconductor devices in a molding machine including an upper die and a lower die, comprises the steps of:
  covering parts of parting faces of the dies, which are capable of clamping a semiconductor wafer, with release film, which is easily peelable from the dies and resin for molding;
  providing the resin onto one side face of the semiconductor wafer;
  clamping the semiconductor wafer by the dies together with the release film so as to mold the one side face of the semiconductor wafer; and forming the semiconductor devices by cutting the molded semiconductor wafer.

The resin molding machine, comprises:
  an upper die and a lower die for clamping a member to be molded, which includes a substrate on which semiconductor chips and/or circuit elements are mounted;
  a plurality of cavities being formed in one of the dies, the cavities being capable of accommodating the semiconductor chips and/or the circuit elements;
  a release film feeding mechanism for feeding release film, which is easily peelable from the dies and resin for molding, so as to cover inner faces of the cavities and a parting face of one of the dies, which contacts the substrate; and
  a resin filling mechanism for sending the resin from a pot to the cavities while the member to be molded is clamped by the dies together with the release film,
  whereby the semiconductor chips and/or the circuit elements are respectively molded with resin.

The resin molding machine, comprises:
  an upper die and a lower die for clamping a member to be molded, which includes a substrate on which semiconductor chips and/or circuit elements are mounted;
  a plurality of cavities being formed in the lower die, the cavities being capable of accommodating the semiconductor chips and/or the circuit elements; and
  a release film feeding mechanism for feeding release film, which is easily peelable from the dies and resin for molding, so as to cover inner faces of the cavities and a parting face of the lower die, which contacts the substrate,
  wherein the member to be molded is clamped by the dies together with the release film and molded with the resin which is supplied into a space enclosed with the release film.

And, the resin molding machine for molding a whole one side face of a semiconductor wafer, comprises:
  an upper die and a lower die for clamping a semiconductor wafer;
  a molding section being formed in a parting face of one of the dies; and
  a release film feeding mechanism for feeding release film, which is easily peelable from the dies and resin for molding, so as to cover the parting faces of the dies,
  wherein the semiconductor wafer is clamped by the dies together with the release film and molded with the resin which is supplied into the molding section.

In the method of the present invention, one side face of the substrate, on which a plurality of the semiconductor chips, or the semiconductor wafer can be easily and securely molded with resin. By using the release film, structures of the dies can be simple, no resin flash is formed, and highly reliable semiconductor devices can be manufactured.

In the resign molding machine of the present invention, the resin-molded parts of the member to be molded can be easily and securely molded with resin. One side of the semiconductor wafer, etc. can be properly molded.

BRIEF DESCRIPTION OF THE DRAWINGS

Embodiments of the present invention will now be described by way of examples and with reference to the accompanying drawings, in which.

DETAILED DESCRIPTION OF THE PREFERRED EMBODIMENTS

Figure 1:
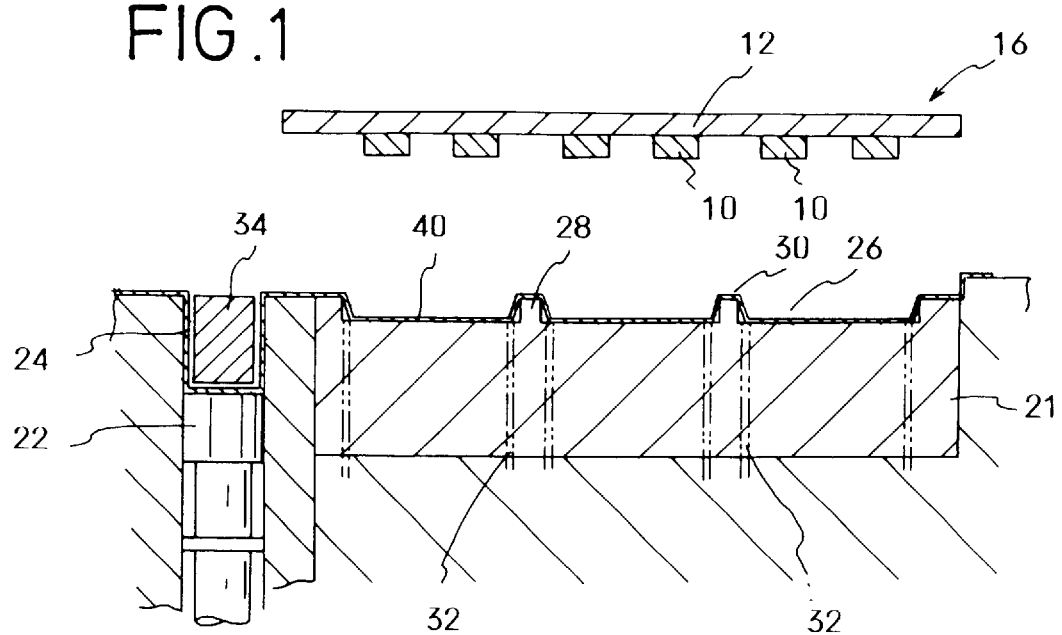
FIG. 1 is a sectional view of a resin molding machine of an embodiment of the present invention wherein a member to be molded is set therein.

Preferred embodiments of the present invention will now be described in detail with reference to the accompanying drawings.

A resin molding machine of an embodiment of the present invention will be explained with reference to FIGS. 1 and 2.

A plurality of semiconductor chips 10 are mounted on each member 16 to be molded. In each member 16, the semiconductor chips 10 are matrically arranged, on a substrate 12, with regular separations. In the present embodiment, a plurality of multi-chip modules, each of which includes a couple of semiconductor chips 10, are produced from the member 16 as semiconductor devices. The method of the present embodiment can be, of course, applied to semiconductor devices, each of which includes one semiconductor chip 10, three semiconductor chips 10 or more, or circuit elements, e.g., resistance.

The members 16 are clamped by an upper die 20 and lower dies 21, and resin is sent from a pot 24 to cavity spaces 26 to mold the members 16. The melted resin is pressurized by a plunger 22.

In the present embodiment, cavities 26a are formed in the lower dies 21, a side face of each member 16, on which the semiconductor chips 10 are mounted, is headed downwardly, then the members 16 are set in the lower dies 21. Note that, in the case of forming the cavities in the upper die 20, the side faces of the members 16, on which the semiconductor chips 10 are mounted, is headed upward.

Figure 3:
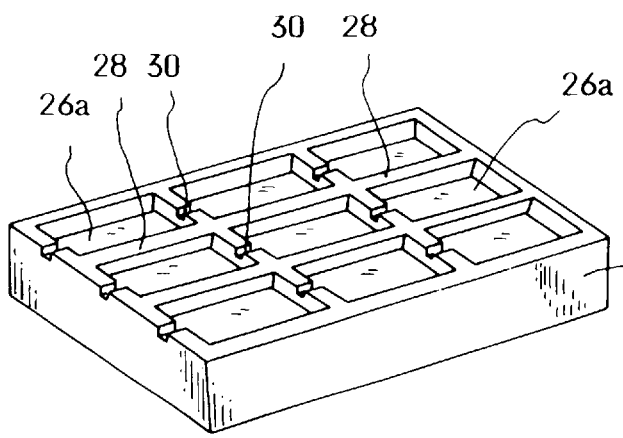
FIG. 3 is a perspective view of a lower die of the resin molding machine.

A perspective view of the lower die 21 is shown in FIG. 3. The cavities 26a of the lower die 21 are arranged to correspond to the arrangement of the semiconductor chips 10 in the substrate 12. The adjacent cavities 26a are divided by parting sections 28. In the present embodiment, the parting sections 28 are formed like a latticework to divide the rectangular cavities 26a. Upper faces of the parting sections 28 are located at the same level, and they act as parts of a parting face of the die.

Runner paths 30 respectively communicate the adjacent cavity spaces 26. Each runner path 30 is formed by partially cutting the parting section 28, so that the adjacent cavity spaces 26 can be communicated via the runner path 30. In the present embodiment, three cavities 26a are serially arranged in the longitudinal direction of the die, and they are communicated by the runner paths 30.

Figure 2:
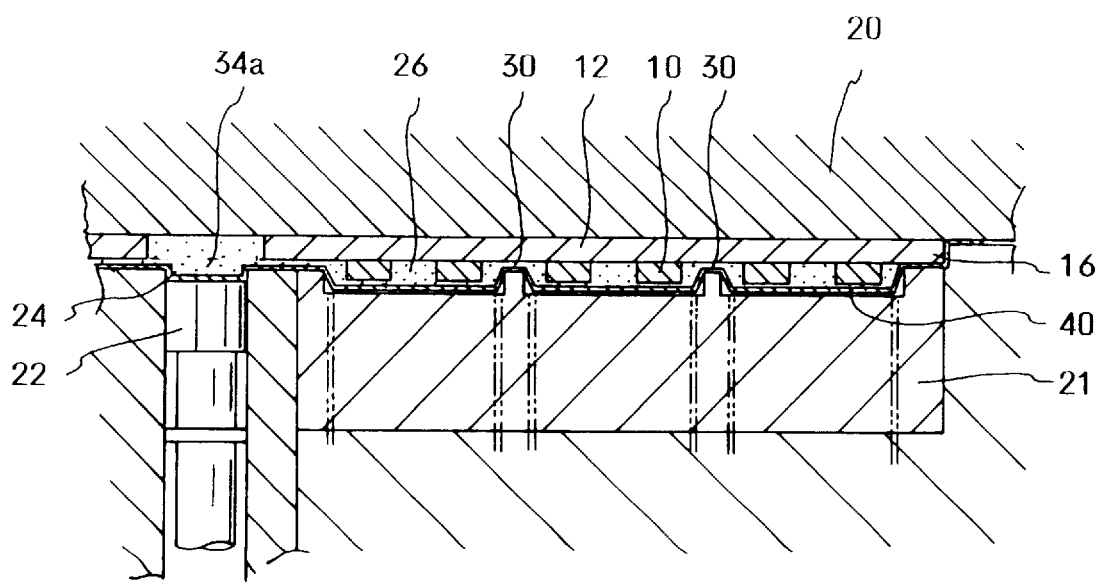
FIG. 2 is a sectional view of the resin molding machine wherein the member to be molded is clamped and molded with resin.

FIG. 1 is the sectional view in which the lower dies 21 are cut by a plane passing through the runner paths 30.

In the present embodiment, the members 16 are clamped by the upper die 20 and the lower dies 21. The characteristic point is that the parting faces of the lower dies 21, which include inner faces of the cavities 26a, are covered with release film 40, so that no resin directly contacts the parting faces while resin molding is executed. The release film 40 has enough heat-resistibility against heat generated from the dies and is easily peelable from the dies. For example, the release film 40 may be made from PTFE, ETFE, PET, FEP, etc. The release film 40 should have enough flexibility and extensibility so as to easily deform along inner faces of the molding sections, e.g., the cavities 26a. Further, the release film 40 should be easily peelable from solidified resin.

In the present embodiment, the lower dies 21 are respectively located on each side of the pot 24. FIG. 1 mainly shows one lower die 21. Of course, the lower die 21 may be located on only one side of the pot 24. Size of the lower dies 21 and number of the cavities 26a of each lower die 21 may be designed according to the members 16, etc.

In FIG. 1, the dies are opened, and the release film 40 is set to cover the lower dies 21 and the pot 24. As shown in the drawing, the release film 40 covers an inner circumferential face of the pot 24 and the whole parting faces of the lower dies 21.

The release film 40 is fed to wholly cover the parting faces, and the feeding action is synchronized with the molding action. The release film 40 may be merely mounted on the parting faces of the dies, preferably the release film 40 is fixed on and along the inner faces of the cavities 26a by sucking air through inner bottom faces of the cavities 26a. Air is sucked through air sucking holes 32 to fix the release film 40. The air sucking holes 32 are formed like, for example, slits and opened in the inner bottom faces of the cavities 26a. The air sucking holes 32 are communicated to an air mechanism for sucking air.

Since the release film 40 has enough flexibility, the release film 40 can be easily deformed and fixed along the inner faces of the cavities 26a by sucking air through the air sucking holes 32. With this action, the cavity spaces 26 for accommodating the semiconductor chips 10 can be formed.

In the pot 24 too, air is sucked through the pot 24, the release film 40 is fixed on the inner circumferential face of the pot 24 and an upper end face of the plunger 22.

To fix the release film 40 in the pot 24, air paths may be formed between the inner circumferential face of the pot 24 and an outer circumferential face of the plunger 22, and the air can be downwardly sucked therethrough. And, air sucking grooves may be vertically formed in the outer circumferential face of the plunger 22, and the air can be sucked therethrough. Since the inner faces of the pot 24 are covered with the release film 40, no resin will be stuck onto the inner faces of the pot 24.

After the release film 40 is fixed on the parting face of the lower dies 21 and the inner faces of the pot 24 by air suction, a resin tablet 34 is supplied into the pot 24 and the members 16 are set in prescribed positions in the lower dies 21. The resin supplied into the pot 24 may be not only the resin tablet but also resin pellets, resin powders, liquid resin, sheet-formed resin, jelly-formed resin, etc. And, the resin may be thermosetting resin and thermoplastic resin.

Next, the members 16 are clamped between the upper die 20 and the lower dies 21, and the resin 34a, which is melted in the pot 24, is pressurized and sent by the plunger 22 so that the cavity spaces 26 are filled with the resin 34a. FIG. 2 shows the state in which the cavity spaces 26 are filled with the resin 34a. Firstly, the cavity space 26 which is the nearest to the pot 24 is filled with the resin 34a, then further cavity spaces 26 are filled in order. Each runner path 30 mutually communicates the adjacent cavity spaces 26 and acts as a resin path to fill the cavity spaces 26 with the resin 34a. After the resin 34a is sent from the pot 24 to all the cavity spaces 26, resin pressure is kept to solidify the resin 34a.

After the resin 34a is solidified, the dies are opened, and the molded products are taken from the lower dies 21. The molded products may be taken out by the steps of: taking out the molded products, together with the release film 40, from the dies; and removing the release film 40 from the molded products, or by the steps of: removing the release film from the molded products in the dies; and separately taking out the molded products and the release film 40 from the dies.

Figure 4:
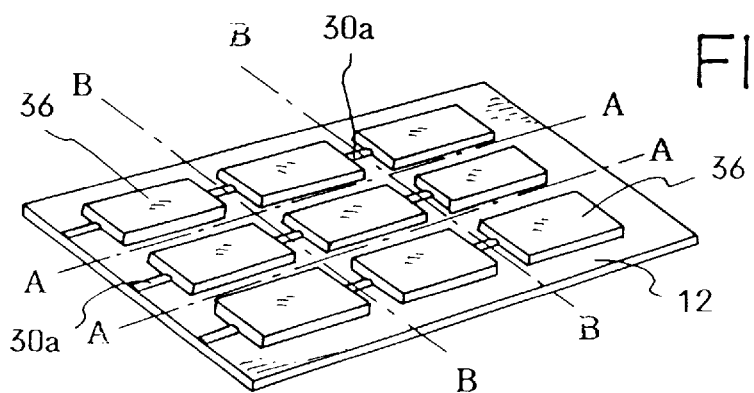
FIG. 4 is a perspective view of the member molded with the resin.

The molded member (product) is shown in FIG. 4. A plurality of rectangular resin-molded sections 36 are matrically arranged on the substrate 12 with regular separations. No resin is stuck between the adjacent resin-molded sections 36, so that the surface of the substrate 12 is partially exposed therebetween. Resin pieces 30a were solidified in the runner paths 30 and stuck to the substrate 12.

The semiconductor devices are completed by dividing the substrate 12 along the resin-molded sections 36. In FIG. 4, lines A—A are dividing lines in the longitudinal direction of the substrate 12; lines B—B are dividing lines perpendicular to the dividing lines A—A. In the products molded by the resin molding machine of the present embodiment, the solidified resin pieces 30a are partially left in the runner paths 30, but the surface of the substrate is partially exposed between the adjacent resin-molded sections 36 so that pieces of the semiconductor devices can be easily gained by cutting the substrate 12 along the dividing lines.

Since the semiconductor devices are separated by cutting the substrate 12 only, a blade of a dicing cutter is not damaged and the semiconductor devices can be easily separated. To easily cut the substrate 12 by the dicing cutter, slit holes may be formed along the dividing lines except the portions in which the runner paths 30 are formed.

Further, notches, which corresponds to the dividing lines, may be formed in the substrate 12. In this case, the substrate 12 is broken along lines including the notches so as to separate the semiconductor devices.

By employing the release film 40, the members 16 to be molded can be securely clamped and properly molded. If the substrate 12 is made of a plastic, thickness of the substrate 12 may vary. But, the difference of the thickness can be absorbed by the release film 40, so that the substrate 12 can be securely molded without forming resin flash on the surface thereof.

In the conventional resin molding machine, the molded products are ejected by ejector pins while the dies are opened. By employing the release film 40, the molded products can be ejected from the dies without ejector pins. Namely, no ejector pins are assembled in the dies, so that structures of the dies can be simpler.

By covering the inner faces of the molding sections, e.g., the cavities, with the release film 40, the resin 34a can smoothly flow on inner faces of the cavities 26a, so that the cavity spaces 26 can be easily filled with the resin 34 and the substrates can be securely molded without forming voids in the resin-molded sections 36. Since the resin 34a can smoothly flow in the cavity spaces 26, semiconductor devices having thin resin-molded sections 36, whose thickness is, for example, 0.1 mm, can be manufactured easily.

In the conventional resin molding machine, the resin, which is capable of smoothly flowing in the cavity spaces 26 and easily peelable from the dies, is selected. In the present embodiment, since the release film 40 is employed, the resin does not directly contact the dies, so that the resin may be selected on the basis of characteristics of filling the cavity spaces 26 and electric characteristics of the semiconductor devices only.

Figure 5:
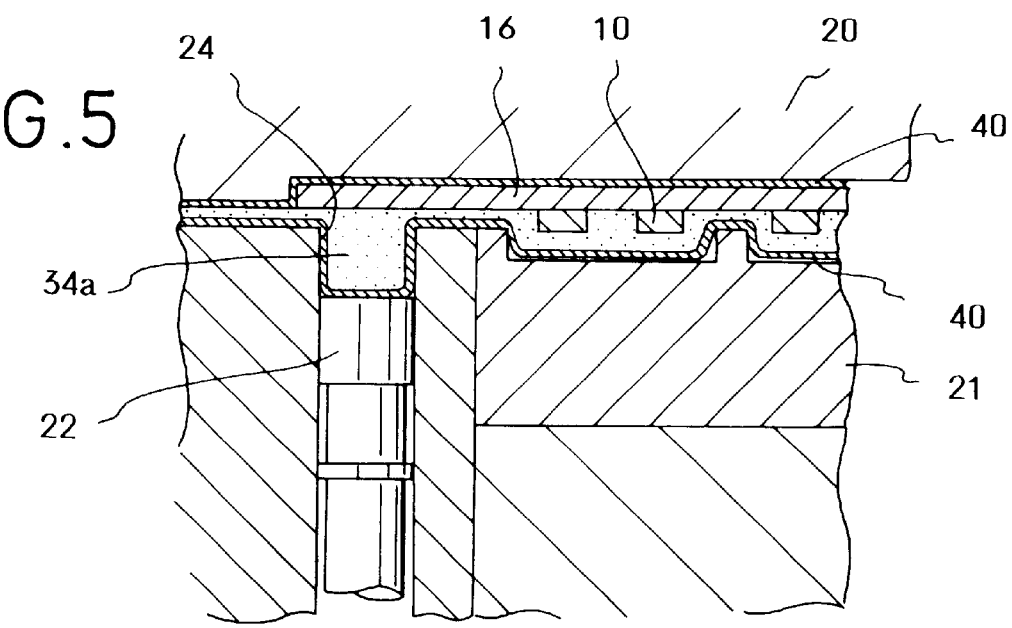
FIG. 5 is a sectional view of the resin molding machine of another embodiment.

The release film 40 may be used as shown in FIG. 5. Two sheets of the release film 40 respectively cover the parting faces of the upper die 20 and the lower die 21. And, the pot 24 may be faced to the substrate of the member 16.

Figure 6:
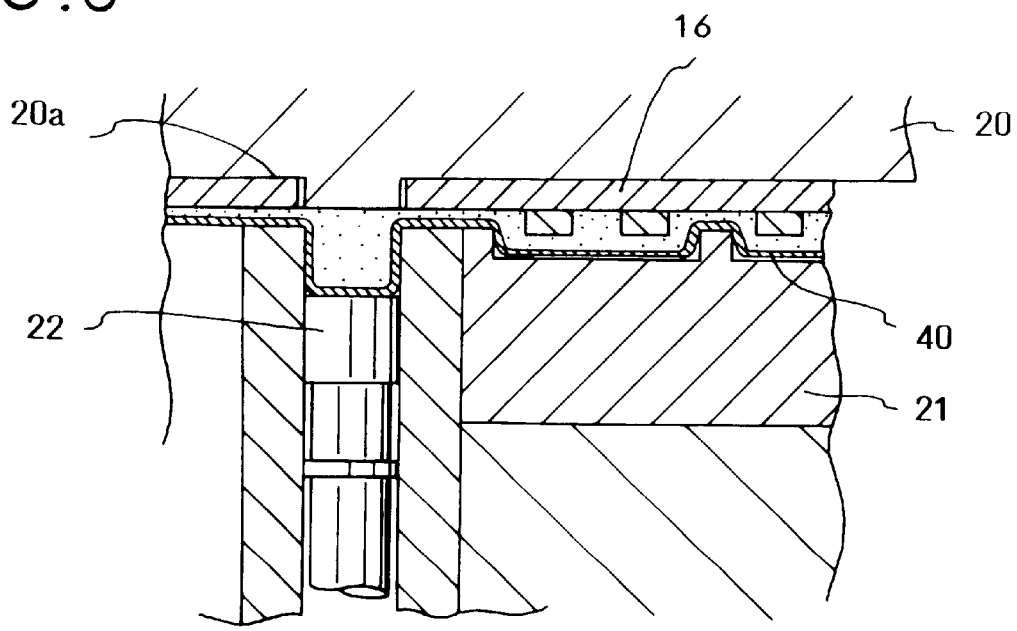
FIG. 6 is a sectional view of the resin molding machine of another embodiment.

Further, as shown in FIG. 6, concave sections 20a, whose depth is equal to the thickness of the member 16 to be molded, may be formed in the upper die 20 so as to accommodate the members 16 respectively therein.

In the present embodiment, the runner paths 30 are formed in the parting sections 28 of the lower dies 21. To leave no solidified resin pieces, which have been solidified in the runner paths 30, on the substrate 12, the dies shown in FIG. 7 may be employed.

Figure 7:
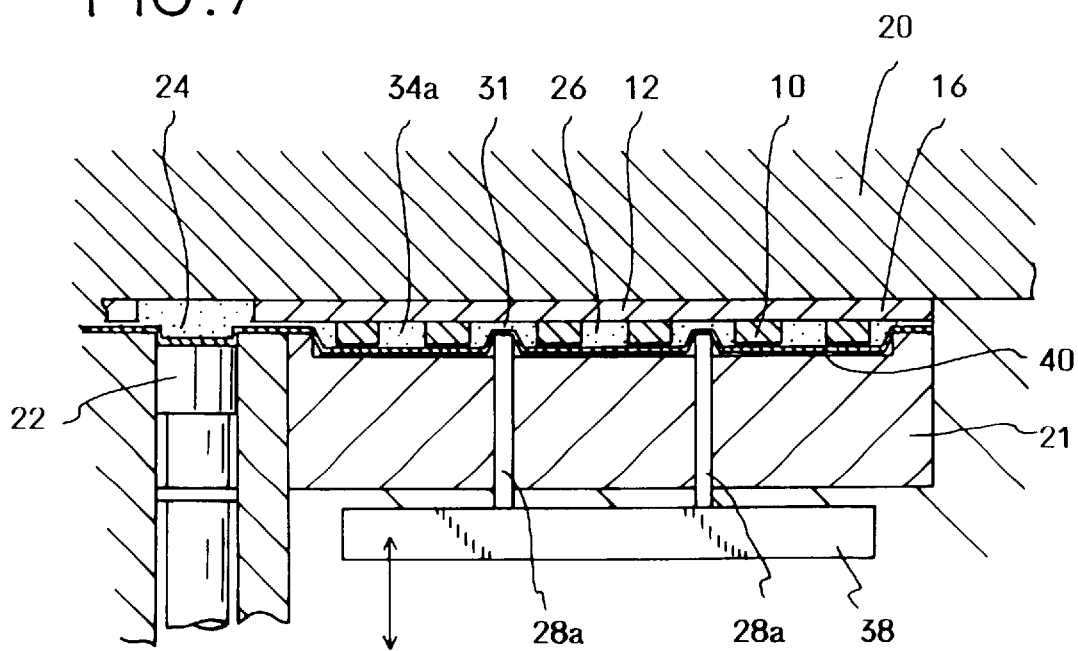
FIG. 7 is a sectional view of the resin molding machine of another embodiment.

In the dies shown in FIG. 7, the parting sections 28a divide the rectangular cavities 26a as well as the parting sections 28 of the lower die 21 shown in FIG. 3. But, the parting sections 28a of FIG. 7 are parting plates, which can be moved in the vertical direction. The parting plates 28a are supported by a supporting plate 38, which is moved in the vertical direction.

In FIG. 7, the members 16 are clamped by the upper die 20 and the lower dies 21 together with the release film 40, and the resin 34a is sent from the pot 24 to the cavity spaces 26. Since upper end faces of the parting plates 28a are separated from the bottom face of the substrate 12 so as to form the resin paths 31, which mutually communicate the adjacent cavity spaces 26, when the cavity spaces 26 are filled with the resin 34a, all the cavity spaces 26 can be filled with the resin 34a. Upon filling all the cavity spaces 26 with the resin 34a, the supporting plate 38 is moved upward until the upper end faces of the parting plates 28a contact the bottom face of the substrate 12, so that each cavity space 26 can be perfectly divided.

Figure 8:
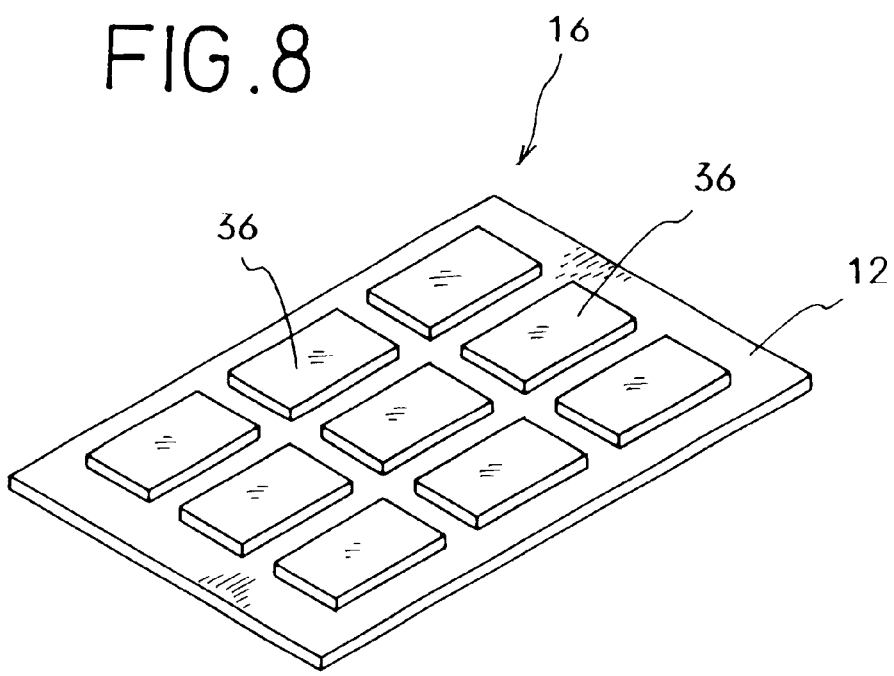
FIG. 8 is a perspective view of a member molded with resin.

With this manner, no resin pieces are left in the resin paths 31, each of which is formed on the bottom face of the substrate 12 and communicates the adjacent cavity spaces 26, after completing the molding action, so that the molded product whose resin-molded sections 36 are perfectly separated on the substrate 12 can be produced as shown in FIG. 8. Since the resin-molded sections 36 are perfectly separated, the pieces of the semiconductor devices can be easily produced by cutting the substrate 12.

The parting plates 28a move in vertical holes bored in the lower dies 21, so the release film 40 can be fixed on and along the inner faces of the cavities 26a by sucking air through the vertical holes. Therefore, no air sucking holes are separately required.

In the above described embodiments, the cavities 26a are formed in the lower dies 21, but the methods can be applied to the resin molding machine in which the cavities 26a are formed in the upper die 20. In the case of forming the cavities 26a in the upper die 20, the resin paths for mutually communicating the cavity spaces 26 are formed in the upper die 20.

Figure 9:
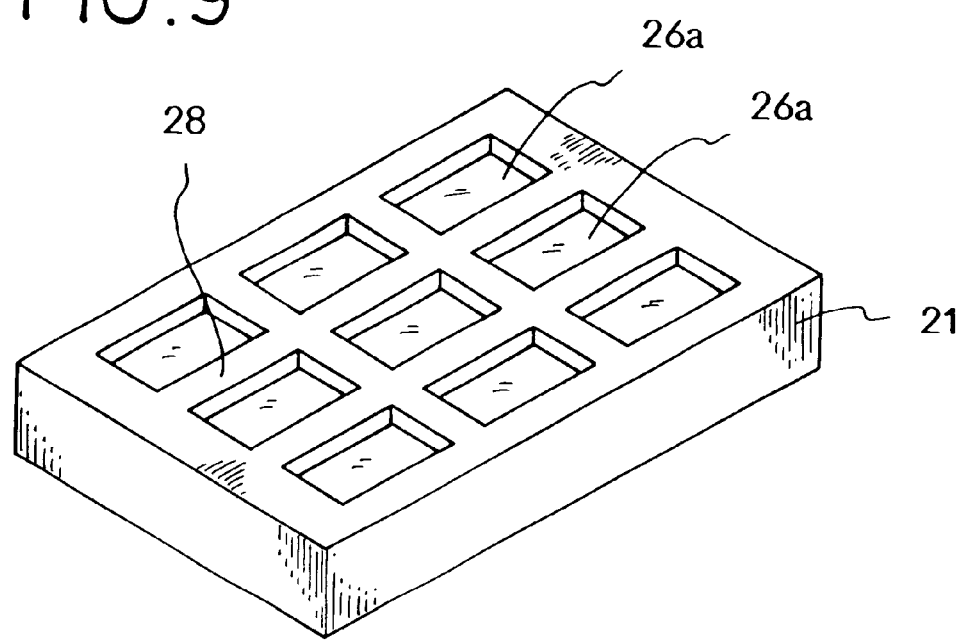
FIG. 9 is a perspective view of a lower die.

A molding die in which the cavities 26a are perfectly divided by the parting sections 28 is shown in FIG. 9. In the above described embodiments, the adjacent cavity spaces 26 are mutually communicated by forming the runner paths 30 in the parting sections 28 or moving the parting plates 28a downward. The member to be molded can be molded by the die 21 shown in FIG. 9, in which the cavities 26a are divided by the fixed parting sections 28 which have no runner paths 30.

Figure 10:
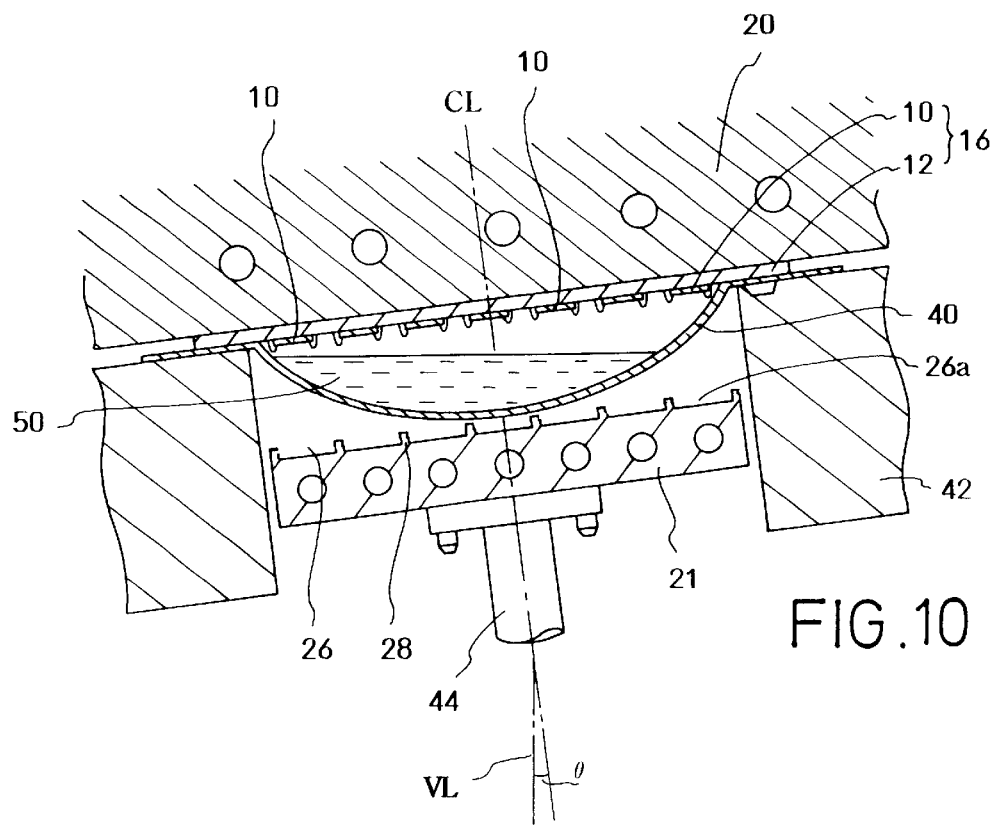
FIG. 10 is a sectional view of a resin molding machine in which a lower die is capable of moving upwardly to mold with resin.

FIG. 10 shows another embodiment in which the lower die 21 has fixed parting sections 28 having no runner paths 30 and the resin is liquid resin. A lower base 42 guides an open-close movement of the lower die 21. A supporting rod 44 is connected to a driving mechanism (not shown) for moving the lower die 21 in the open-close direction. For example, the driving mechanism has a ball bearing screw for moving the supporting rod 44, and a motor for rotating the ball bearing screw, so that the lower die 21 can be linearly moved in the open-close direction.

As shown in FIG. 10, the open-close direction of the lower die 21 is slightly inclined with respect to the vertical line VL, the liquid resin 50 is supplied in a state that the release film 40 is not fixed onto the molding sections of the lower die 21 by air suction, then the member 16 to be molded is clamped and molded. Note that, an angle θ shown in FIG. 10 is an inclination angle of the dies with respect to the vertical line VL.

The release film 40 is fed when the dies are opened, and edges of the release film 40 are supported by the lower base 42, then the liquid resin 50 having prescribed volume is supplied onto the release film 40. FIG. 10 shows a state of clamping edges of the member 16 by the upper die 20 and the lower base 42. The release film 40 is slackened, and the liquid resin 50 is gathered on the release film 40. Since the dies are inclined, the liquid resin 50 is gathered aside to the left side of a center line CL.

The liquid resin 50 has enough volume to fully fill all the cavities formed in the lower dies 21.

In FIG. 10, the lower die 21 is located at the lower end position. The liquid resin 50 is pressed upward, together with the release film 40, by the upward movement of the lower die 21. Since the dies are inclined, firstly the lowest cavity space 26 is filled with the liquid resin 50 then higher cavity spaces 26 are filled in order.

Figure 11:
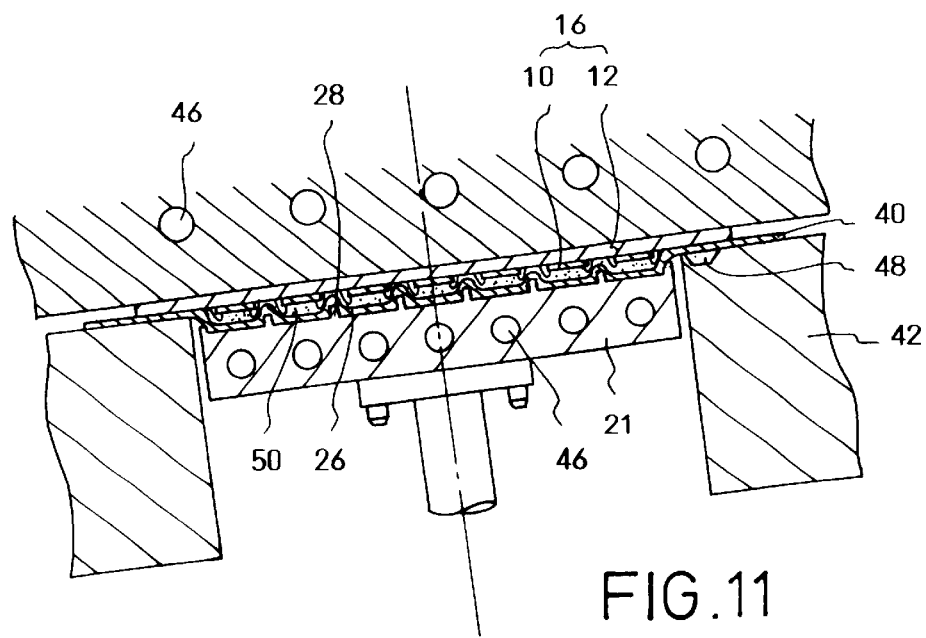
FIG. 11 is a sectional view of a state in which a member to be molded is molded with resin.

A state that the lower die 21 is located at the upper end position and the member 16 is clamped by the upper die 20 and the lower die 21 is shown in FIG. 11. All the cavity spaces 26 are covered with the release film 40 and filled with the liquid resin 50. The member 16 is molded by solidifying the liquid resin 50 in the state of clamping the member 16 by the upper die 20 and the lower die 21. Heaters 46 heat the upper die 20 and the lower die 21.

The lower die 21 has the parting sections 28, which are formed like a latticework, but the dies are inclined and the liquid resin 50 is introduced into the cavity spaces 26, from the lowest cavity space to the higher cavity spaces in order, so that all the cavity spaces 26 can be filled with the liquid resin 50 without forming the runner paths 30 in the parting sections 28. Without forming the runner paths 30 in the parting sections 28, the independent resin-molded sections 36 can be formed on the member 16 as shown in FIG. 8.

In the case of employing the liquid resin 50, the volume of the liquid resin 50 is slightly greater than total volume of the cavity spaces 26 to be filled with the liquid resin 50. An overflow cavity 48, into which the liquid resin 50 which has overflown is collected, is formed in a parting face of the lower base 42. The overflow cavity 48 is formed in the parting face of the lower base 42 and located adjacent to the highest cavity of the lower die 21. The cavity spaces are filled from the lowest cavity space to the higher ones, so the liquid resin 50 finally overflows from the highest cavity space and collected into the overflow cavity 48.

Note that, a resin tablet may be used instead of the liquid resin 50. In this case, the molding action is executed by the steps of: supporting the release film 40 by the lower base 42; supplying the resin tablet onto the release film 40; melting the resin tablet by the heat of the dies; and moving the lower die 21 upward. With this steps, the resin melted is gradually supplied into the cavity spaces, so that the member 16 is molded as well as the case of using the liquid resin 50.

If the resin tablet which forms few voids is used, good resin-molded sections having few voids can be formed as well as the liquid resin 50.

Figure 12:
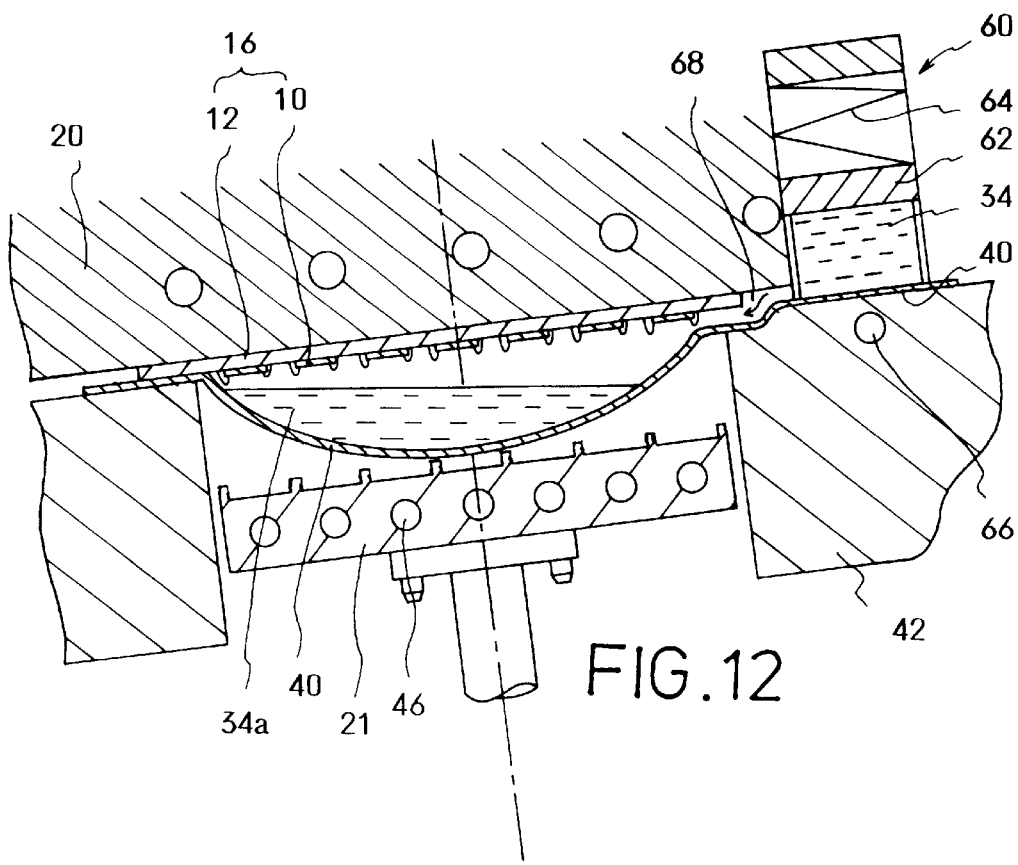
FIG. 12 is a sectional view of a resin molding machine in which a lower die is capable of moving upwardly to mold with resin.

In the resin molding machines shown in FIGS. 10–12, the parting face of the lower die 21 is parallel to that of the upper die 20. For example, level difference between the lowest point of the parting face of the lower die 21 and the highest point thereof, which is caused by inclining the dies, is 0.05 mm, so the member 16 can be gradually clamped from the lowest edge to the highest edge. With this action, the air in the cavity spaces is easily introduced out from the highest side, and the release film 40 is slightly pulled and extended toward the higher side when the release film 40 is clamped, so that no crease is formed in the release film 40.

Another embodiment of the resin molding machine, whose dies are inclined and whose lower die is moved upward and downward, is shown in FIG. 12. A melting section 60, in which the resin tablet 34 is melted, is provided to the upper die 20 or the lower die 21 as a resin supplying section. The melted resin 34a, which has been melted in the melting section 60, is supplied onto the release film 40. As shown in FIG. 12, the melting section 60 is provided to the upper die 20 and has a plate 62 for pressing the resin tablet 34 and a spring 64 for biasing the plate 62. The resin tablet 34 is pressed by the plate 62 and heated, so that the resin tablet 24 is melted. A symbol 66 stands for a heater.

The dies 20 and 21 are inclined as well as the former embodiment, so the melting section 60 is provided to the higher side of the upper die 21. The melted resin 34a, which has been melted in the melting section 60, is pressed and sent to an upper face of the release film 40 by the plate 62. A gate 68 introduces the resin 34a from a base portion of the melting section 60 to the lower die 21.

The action of the resin molding machine will be explained. The release film 40 and the member 16 to be molded are set while the dies are opened, the resin tablet 34 is supplied into the melting section 60, then the upper die 20 and the lower base 42 are closed. Next, the dies are inclined as shown in FIG. 12 so as to supply the melted resin 34a onto the release film 40. The melted resin 34a may be supplied other ways instead of the melting section 60 of the upper die 20. For example, the resin tablet may be supplied into a pot, which is provided in the lower die 21, and the melted resin 34a is sent, by a plunger, from the pot via the gate 68. Resin pellets and liquid resin may be used instead of the resin tablet. The liquid resin may be tightly wrapped with plastic film and formed like a tablet or a pencil.

In the present embodiment, the lower die 21 is the movable die, and the member 16 is clamped by moving the lower die 21 upward. But functions of the dies 20 and 21 may be changed. For example, the upper die 20 may be the movable die, the cavities 26a may be formed in the upper die 20, and the semiconductor chips 10 of the member 16 may be headed upward to be molded. In the present embodiment, the melted resin 34a is supplied into the cavity spaces 26 by the melting section 60 or the pot-plunger mechanism. The parting face of the upper die 20 may be covered with the release film 40 too so as to execute the molding action without sticking the solidified resin onto the parting face of the upper die.

In the resin molding machines shown in FIGS. 10–12, the plate-shaped lower die 21, in which the cavities 26a are formed, is moved upward to mold the member 16 without pressurizing and sending the resin from the pot to the cavity spaces.

Figure 13:
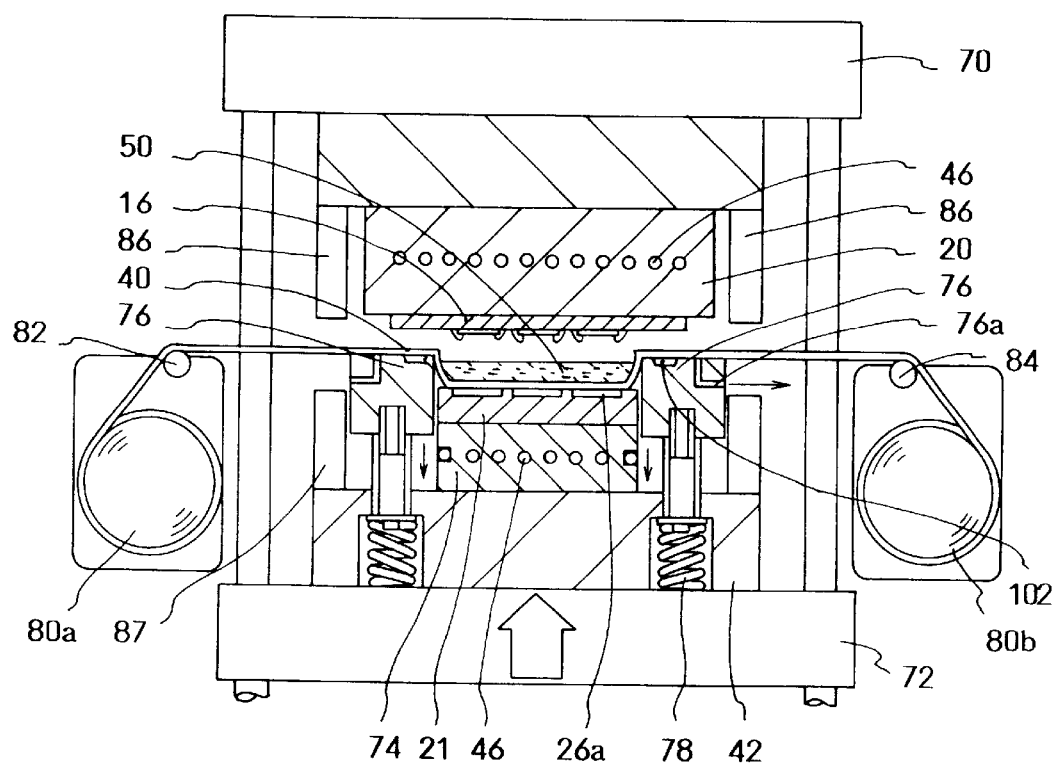
FIG. 13 is an elevation view of a resin molding machine in which a lower die is capable of moving upwardly to mold with resin.

Another embodiment, in which the lower die 21 is capable of vertically moving, is shown in FIG. 13.

In FIG. 13, the upper die 20 is fixed to a fixed platen 70; the lower die 21 is fixed to a movable platen 72 so as to vertically move the lower die 21. In the embodiments shown in FIGS. 10–12, the lower dies 21 are inclined with respect to the vertical line. In the present embodiment, the lower die 21 is moved in the vertical direction. The lower die 21 is fixed to the lower base 42 with a base block 74, and the lower base 42 is fixed to the movable platen 72. With this structure, the lower die 21 is moved by the movable platen 72.

Clampers 76 clamp outer edges of the member 16. The clampers 76 are always biased toward the upper die 20 by springs 78 and capable of vertically moving with respect to the movable platen 72. Note that, the dampers 76 may be biased by other means, e.g., air cylinder units. In the case of employing the air cylinder units, upper end faces of the dampers 76 are coincided with inner bottom faces of the cavities 26 when the member 16 is set in the lower die 21, so that the member 16 can be set on a flatter surface. With this structure, especially in the case of molding large members, e.g., semiconductor wafers, breaking the members 16 can be prevented.

There are provided a feeding roll 80a, which feeds the new release film 40, and a collecting roll 80b, which collects the used release film 40, in the resin molding machine. The release film 40 is intermittently fed from the feeding roll 80a to the lower die 21 and wound around the collecting roll 80b with the molding steps of the machine. A feed roller 82 feeds the release film 40; a collect roller 84 pulls the release film 40.

The action of the resin molding machine will be explained.

Firstly, the lower die 21 is located at the lowest position, and the new release film 40 is fed onto the lower die 21. When the lower die 21 is located at the lowest position, the upper end (clamping) faces of the dampers 76 are upwardly projected from the parting face of the lower die 21 by the elasticity of the springs 78. The release film 40 covers over the upper end faces of the dampers 76 and is fixed thereon by sucking air through air sucking holes 76a, which are respectively formed in the dampers 76.

Next, air is sucked through air sucking holes, which are opened an inner bottom face of the lower die 21, so that a resin reservoir section, which is encased by the lower die 21 and the dampers 76, in the release film 40. The liquid resin 50 is supplied into the resin reservoir section.

A plurality of the semiconductor chips 10 are mounted on a bottom face of the substrate 12 of the member 16. The member 16 is correctly set on the upper die 20 or the clampers 76 which have been covered with the release film 40.

After the member 16 is set, the movable platen 72 is moved upward so as to clamp the member 16 by the upper die 20, the clampers 76 and the lower die 21. When the movable platen 72 is moved upward, firstly the outer edges of the member 16 are clamped by the dampers 76 and the upper die 20, then the movable platen 72 is further moved upward, so that the member 16 is clamped by the upper die 20 and the lower die 21. After the movement of the dampers 76 are stopped, the springs 78 are compressed while the lower die 21 is moved upward.

Stoppers 86 and 87 define the highest position of the lower die 21. The lower die 21 is capable of upwardly moving until end faces of the stoppers 87 contact end faces of the stoppers 86. The stoppers 86 and 87 are provided so as not to excessively clamp and damage the member 16 by the movable platen 72.

In the state of clamping the outer edges of the member 16, wires, the semiconductor chips 10 and the substrate 12 are soaked into the liquid resin 50 in order by moving the lower die 21 upward. With soaking them into the liquid resin 50, the liquid resin 50 pushes the release film 40 and fills the cavity spaces 26, so that the wires and the semiconductor chips 10 are molded with the resin.

When the lower die 21 reaches the highest position, the liquid resin 50 is heated to solidify. The upper die 20 and the lower die 20 have been heated by the heaters 46.

After the resin is solidified, the movable platen 72 is moved downward so as to open the dies. When the dies are opened, firstly the lower die 21 is moved downward with clamping the molded member 16 by the dampers 76, then the clampers 76 are moved downward with supporting the molded member 16. Upon fully opening the dies, the molded member 16 is taken out from the die, the air suction is stopped to release the release film 40 from the dampers 76, then the new release film 40 is fed. The resin molding machine is ready to mold the next member to be molded.

In the present embodiment, the plate-shaped lower die 21, which includes a plurality of the cavities 26a, is moved by the movable platen 72, so resin pressure effectively works to the member 16. Thus, in comparison with a transfer resin molding machine, a small-powered press mechanism can be employed. In the conventional transfer resin molding machine, the output power of the press mechanism is about 120 ton, and thrust force of a plunger is about 3 ton; in the resin molding machine of the present embodiment, required output power of the press mechanism is about 15 ton.

The resin molding machine of the present embodiment is capable of molding large sized plate members, e.g., A3, A4, with the resin. The heaters 46 are assembled in the upper die 20 and the lower die 21, the members 16 are heated from the both side faces so as to accelerate the solidification of the resin, so that working efficiency of the molding action can be improved. Note that, preferably calorific power of the heaters which locate center parts of the dies are greater than others, so that the resin can be solidified from a center and deformation of the molded member can be prevented. If a heater is provided to a loader, which sets the member 16 in the die, so as to preheat the member 16, the deformation of the molded member 16 can be further prevented.

In the present embodiment, the member 16 is clamped between the dies 20 and 21 by vertically moving the lower die 21, the deformation of the wires connected to the semiconductor chips can be prevented, so that reliable molding can be executed. Further, no stress is stored in the solidified resin, so that the deformation of the molded member can be prevented.

Since the resin molding is executed with using the release film 40, borders of the cavities 26 can securely clamp the substrate 12 even if the thickness of the substrate 12 is partially different, so that no resin flash is formed on the surface of the substrate 12. By covering the lower die 21 with the release film 40, no resin is stuck onto the lower die 21 and the dampers 76 and invades into movable parts of mechanisms, so that the movable parts can move smoothly.

Figure 14:
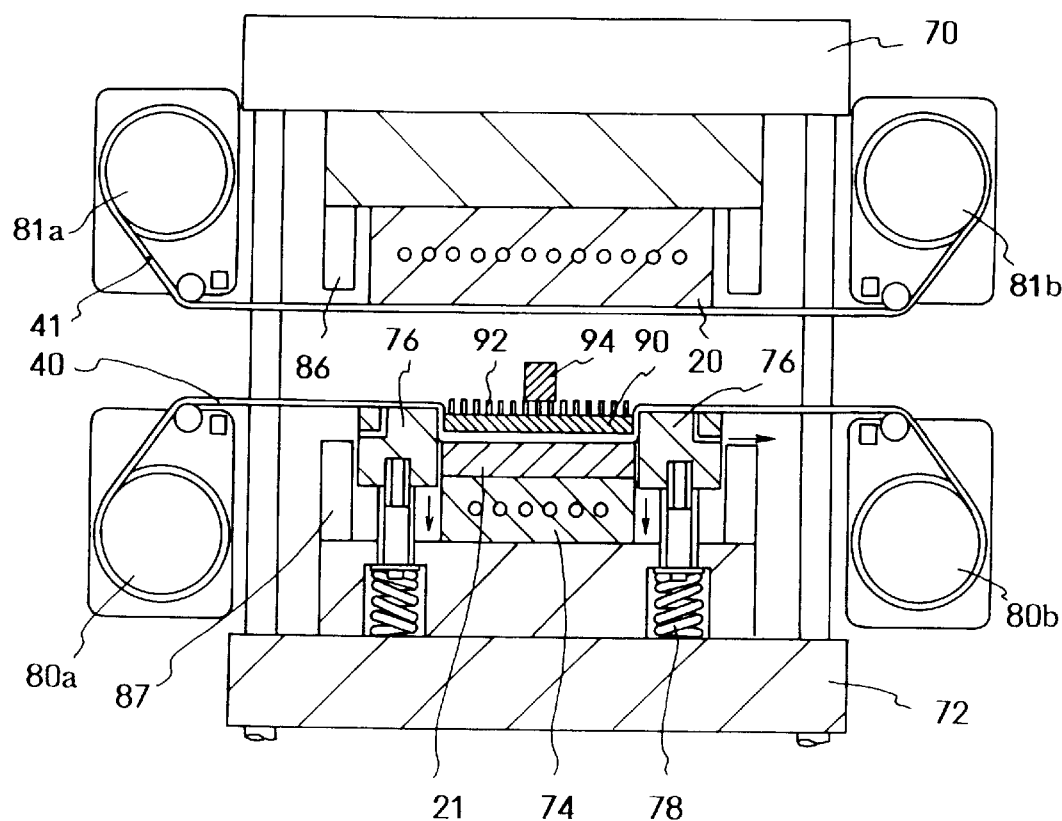
FIG. 14 is an elevation view of a resin molding machine in which a semiconductor wafer is molded.
Figure 15:
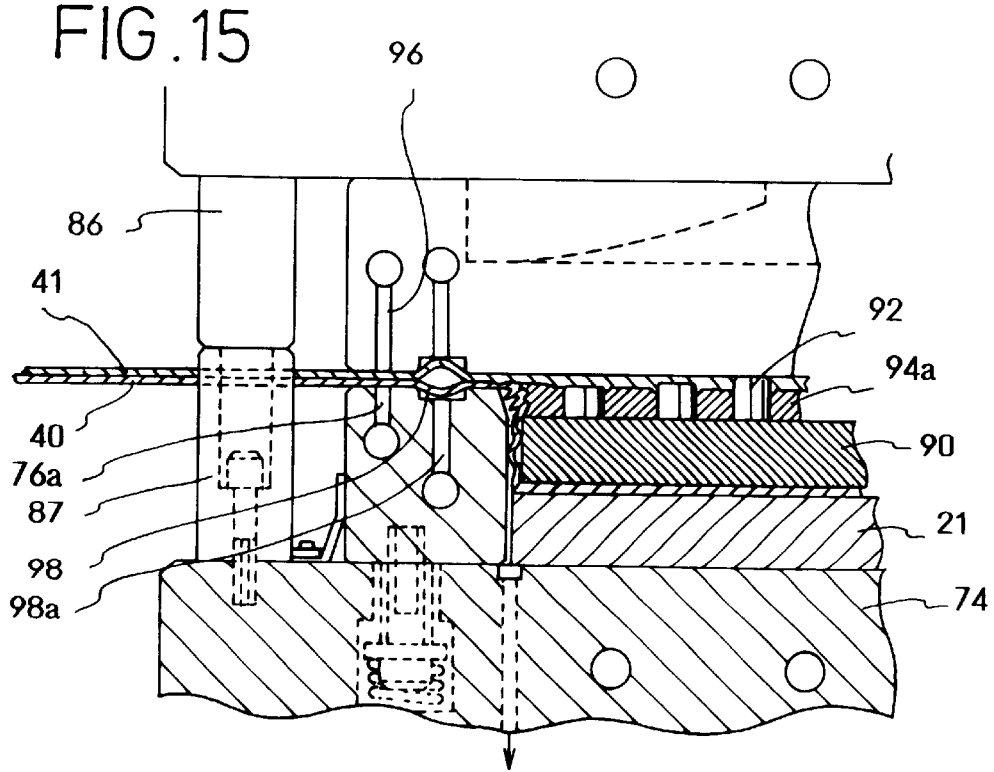
FIG. 15 is an enlarged sectional view of the semiconductor wafer molded with resin.

Another embodiment of the resin molding machine, in which the lower die 21 is vertically moved to mold a semiconductor wafer 90, is shown in FIGS. 14 and 15.

A plurality of pillars 92, to which external terminals will be connected, are vertically formed on an upper face of the semiconductor wafer 90, and the upper face will be molded with resin except upper end faces of the pillars 92. After molding, the semiconductor wafer 90 is divided into a plurality of products.

As shown in FIG. 14, the lower die 21 is supported by the movable platen 72, the damper 76 is biased by the springs 78, and the release film 40 is fed to the lower die 21 as well as the former embodiment. However, in the present embodiment, the semiconductor wafer 90 is set in the lower die 21 with heading the surface to be molded is upward, and release film 41 is fed to the parting face of the upper die 20. The release film 41 prevent the resin from sticking onto the upper die 20. The resin molding machine has a feeding roll 81a, which feeds the new release film 41, and a collecting roll 81b, which collects the used release film 41.

The action of the resin molding machine of the present embodiment will be explained. Firstly, the dies are opened, the release film 41 is fed onto the parting face of the upper die 20, the release film 40 is fed onto the parting face of the lower die 21, and the release film 40 is fixed on the damper 76 by air suction.

Next, air is sucked through the air sucking holes, which are opened an inner bottom face of the lower die 21, so that a concave section, which is encased by the lower die 21 and the damper 76, in the release film 40. The semiconductor wafer 90 is set in the concave section.

Resin 94 is set at a center of the semiconductor wafer 90. FIG. 14 shows the state in which the resin 94 has been set.

Then, the movable platen 72 is moved upward so as to clamp. Firstly, the resin 94 is clamped, then the damper 76 contacts the upper die 20.

The damper 76 contacts the upper die 20, and the movable platen is further moved upward, so that the lower die 21 moves the semiconductor wafer 90 upward. The upward movement of the semiconductor wafer 90 caused by the lower die 21 is stopped when the stoppers 87 of the lower die 21 contact the stoppers 86 of the upper die 20. In this state, the resin 94 is melted, and the melted resin 94a fills spaces between the pillars 92. Thickness of the molded product is defined.

When the lower die 21 is moved upward, the resin 94 is gradually melted, the melted resin 94a flows from the center to an outer edge of the semiconductor wafer 90, and finally the melted resin 94a fill the spaces between the pillars 92.

FIG. 15 shows a state in which the lower die 21 is located at the highest position and the stoppers 86 and 87 contact each other. The melted resin 94a fills the spaces between the pillars 92, which are vertically provided on the upper face of the semiconductor wafer 90, the upper ends of the pillars 92 slightly bite the release film 41, so that no resin 94a is stuck on the upper end faces of the pillars 92. Even if height of the pillars are slightly different, the difference can be absorbed by the release film 41, so that the upper end faces of the pillars 92 can be exposed after molding. The release film 41 is fixed on the parting face of the upper die 20 by sucking air through air sucking holes 96. A symbol 98 stands for an overflow cavity.

Figure 16:
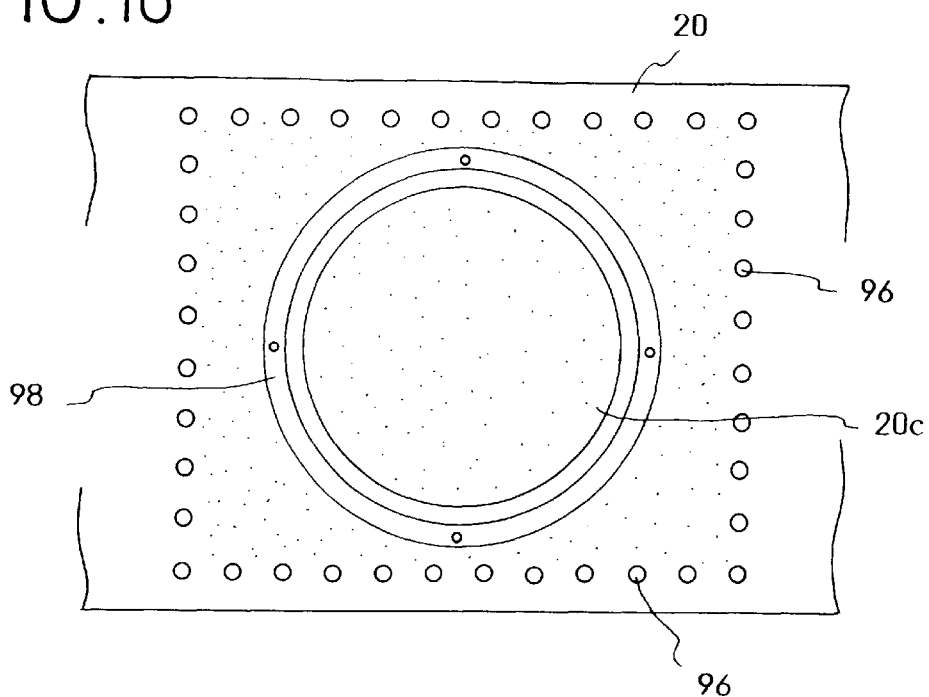
FIG. 16 is a plan view of an upper die of the resin molding machine.
Figure 17:
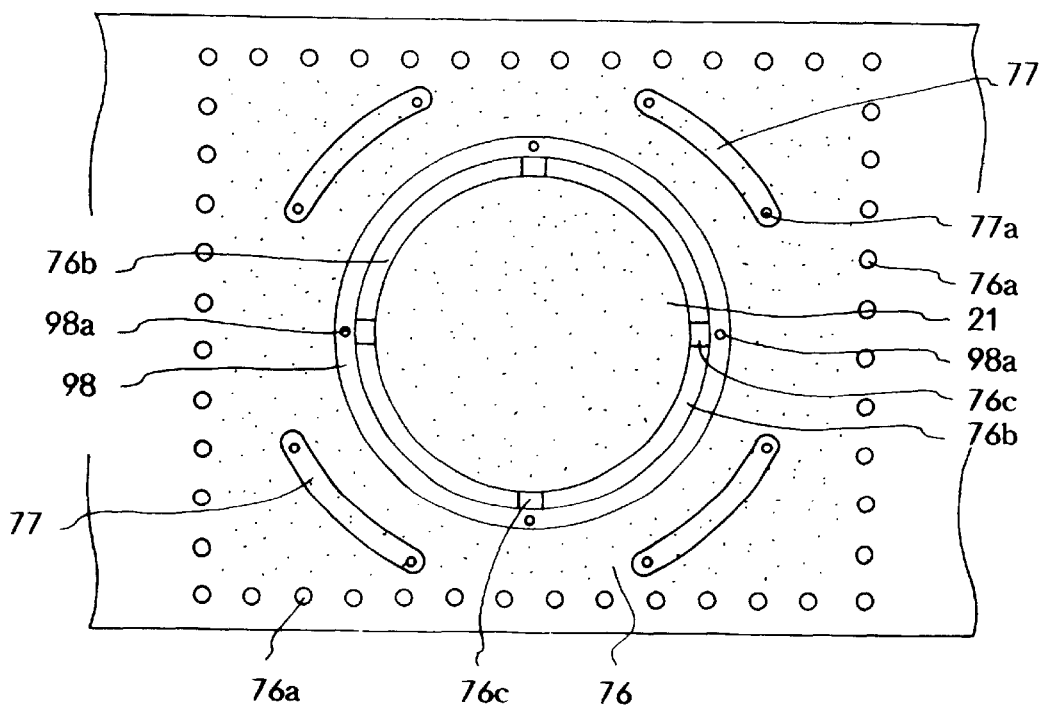
FIG. 17 is a plan view of a lower die of the resin molding machine.

FIG. 16 is a plan view of the upper die 20 shown in FIG. 15; FIG. 17 is a plan view of the lower die 21 shown therein. In FIG. 16, a circular pressing face 20c is formed in the parting face of the upper die 20 and capable of pressing the semiconductor wafer 90. A plurality of air sucking holes 96, which are capable of fixing the release film 41 on the upper die 20 by air suction, are arranged to enclose the pressing face 20c. The air sucking holes 96 are rectangularly arranged, but they may be coaxially circularly arranged with respect to the pressing face 20c.

The parting faces surrounded by the air sucking holes 96 and 76a, which include the inner bottom faces of the cavities, of the dies 20 and 21 are mat-finished by electric discharge machining, sandblast machining, etc., so that fine projections are formed therein. By forming the fine projections, frictional resistance can be reduced and the release film can be moved smoothly, so that the release film can be correctly positioned. The fine projections reduce heat conductivity of the dies, so that the release film is gradually heated and expanded, and the release film can be wholly drawn by air suction. Further, air can be easily introduced outside, so creases of the release film can be gradually removed by continuously sucking air.

Fine grooves may be formed the parting faces instead of said fine projections. Clamping faces of the dies may be formed into smooth flat faces.

As shown in FIG. 17, a planar shape of the lower die 21, which supports the semiconductor wafer 90, is a circular shape whose diameter is designed on the basis of that of the semiconductor wafer 90. The clamper 76 is capable of slidably moving on an outer circumferential face of the lower die 21. A clamping projection 76b is provided on the surface of the damper 76 and encloses the lower die 21. The clamping projection 76b is slightly projected from the parting face so as to securely clamp a border part of a resin-molded part. Overflow gates 76c are formed by partially cutting the clamping projection 76b.

The overflow cavity 98 circularly encloses the clamping projection 76b. Air vents 98a are opened in an inner bottom face of the overflow cavity 98 and communicated with an air mechanism for sucking air so as to draw the release film 40 into the overflow cavity 98. There is formed another overflow cavity 98 in the upper die 20 as well as the lower die 21.

Sucking grooves 77 are provided, in the lower die 21, on the outer side of the overflow cavity 98. In the present embodiment, four sucking grooves 77 are provided with regular separations. Each sucking grooves 77 has air sucking holes 77a, which are opened in an inner bottom face thereof. The air sucking holes 77a are also communicated with the air mechanism so as to draw the release film 40 into the sucking grooves 77. By sucking slackened parts of the release film 40 into the sucking grooves 77, creases of the release film 40 can be removed. The sucking grooves 77 may be one circular groove. Note that, if the overflow cavity 98 has a deeper portion therein, the slackened parts of the release film 40 can be drawn thereinto as well as the sucking grooves 77.

Figure 18:
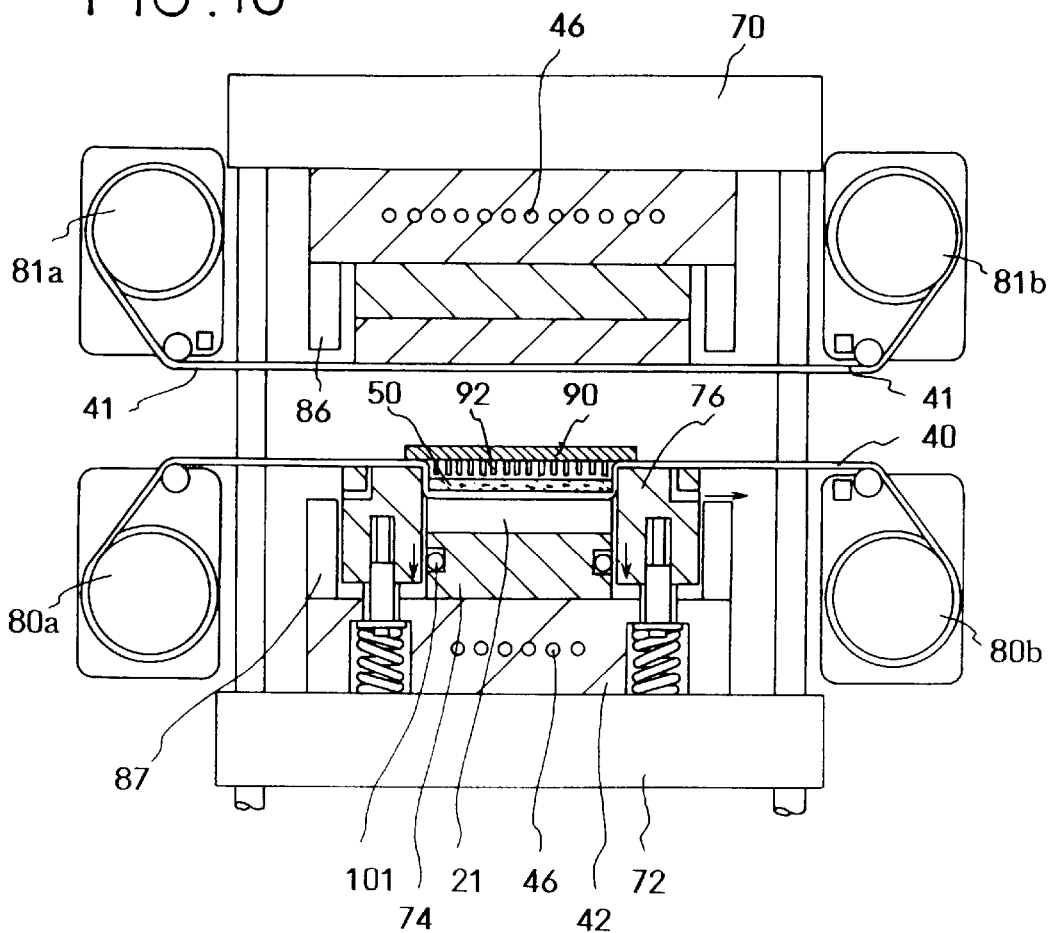
FIG. 18 is an elevation view of a resin molding machine in which a semiconductor wafer is molded.

Another embodiment, in which the surface of the semiconductor wafer 90 on which the pillars 92 are vertically provided is headed downward, is shown in FIG. 18. In the present embodiment, the release film 40 and 41 are respectively fed onto the lower die 21 and the upper die 40, the damper 76 is provided, and the movable platen 72 supports the lower die 21 as well as the former embodiment. A seal ring 101 is provided so as to suck the air through air suckingholes opened in an inner bottom face of the lower die 21.

In the present embodiment, the release film 40 and 41 are set on the dies 20 and 21, then the semiconductor wafer 90 is set in the lower die 21 by supporting an outer edge of the semiconductor wafer 90 by an upper face of the damper 76, and the liquid resin 50 is supplied into a concave section encased by the lower die 21 and the damper 76. FIG. 18 shows the state in which the liquid resin 50 is supplied.

Successively, the outer edge of the semiconductor wafer 90 is clamped between the upper die 20 and the damper 76 by moving the movable platen 72 upward, then the lower die 21 is further moved upward. The upward movement of the lower die 21 is stopped when the stoppers 87 contact the stoppers 86. With the upward movement of the lower die 21, the lower face of the semiconductor wafer 90 including the pillars 92 is wholly soaked into the liquid resin 50. When the lower die 21 reaches the highest position which defines the thickness of a resin-molded section of the molded product, lower ends of the pillars 92 slightly bite the release film 40, so that no resin will stick onto lower end faces of the pillars 92 and the lower end faces of the pillars 92 can be exposed after completing the molding action.

The above described methods, in which the dies 20 and 21 are covered with the release film 40 and 41 when the surface of the semiconductor wafer 90 including the pillars is molded, can be property applied to mold one surface of the semiconductor wafer 90 except the end faces of the pillars 92. By covering the parting faces of the dies 20 and 21 with the release film 40 and 41, no resin will stick onto the parting faces, so that a step of cleaning the parting faces is not required. Namely, the molding action can be executed under a clean condition and reliable products can be manufactured.

In the resin molding machines shown in FIGS. 13, 14 and 18, the lower die 21 is supported and moved by the movable platen 72, but the member 16 may be clamped by vertically moving the upper die 20 instead of the lower die 21. Namely, the member 16 is clamped by relative movement of the upper die 20 and the lower die 21.

Figure 19:
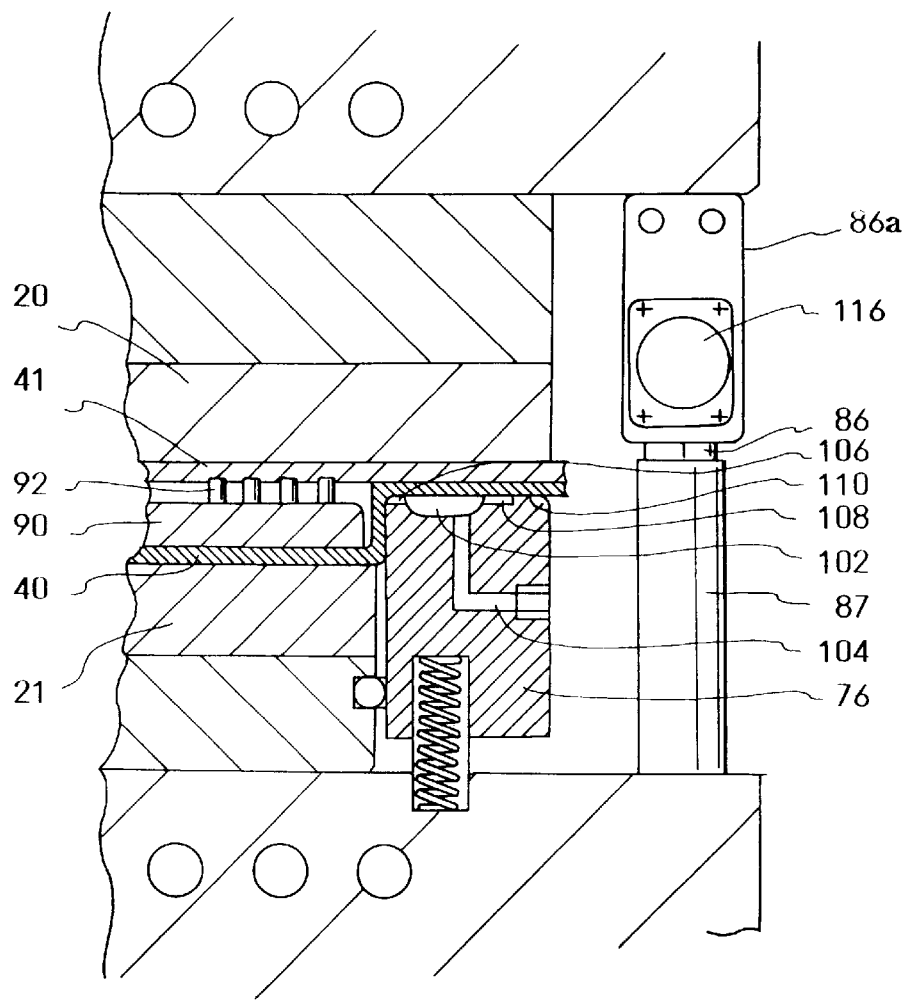
FIG. 19A is a sectional view showing a damper of the resin molding machine.
FIG. 19B is a partial plan view of the clamper.
Figure 19B:
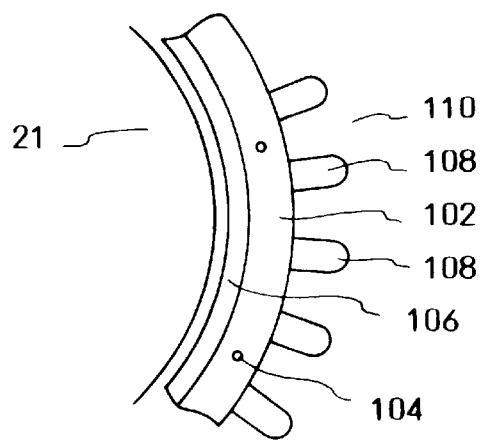

Another embodiment is shown in FIGS. 19A and 19B. In the resin molding machine, the damper 76 has an overflow cavity 102, and the length of the stoppers 86 and 87 can be adjusted.

The overflow cavity 102 is communicated to the air mechanism via air paths 104. A symbol 106 stands for an overflow gate, and a symbol 108 stands for air vents. FIG. 19A is a plan view showing the overflow cavity 102, the overflow gate 106 and the air vents 108. The overflow cavity 102 is formed like a ring-shaped groove, and the overflow gate 106 is formed on the inner side thereof. The air vents 108 are radially outwardly extended from the overflow cavity 102 with regular separations. The release film 40 and 41 are clamped by a clamping face 110.

The resin overflown from the molding section (cavity space) of the die is introduced into the overflow cavity 102, whose inner face is covered with the release film 40. Pressure can be applied to the resin in the cavity space by pressurizing the air in the overflow cavity 102 via the air paths 104, so that reducing the resin pressure can be prevented. Resistance caused by discharging the resin to the overflow cavity 102 can be controlled by controlling the air pressure in the air paths 104. The thickness of the resin-molded section of the molded product can be precisely controlled by amount of the resin discharged into the overflow cavity 102.

A motor 116 controls the length of the stopper 86 of the upper die 20. The stopper 86 is projectably held in a guide rod 86a. A oval cam (not shown), which is linked with the stopper 86, is fixed to an output shaft of the motor 116 so as to the projected length of the stopper 86 can be controlled by a rotational position of the oval cam. Thickness of the members to be molded are slightly different according to type and lot of the members. For example, the thickness of the semiconductor wafers 90 are different according to thickness of protecting layers, length of the pillars 92, etc. Thus, the difference is absorbed by adjusting the projected length of the stoppers 86. In the present embodiment, the projected length of the stoppers 86 are adjusted about ±0.1 mm.

In the resin molding machine whose lower die 21 is vertically moved to mold, the resin pressure can be effectively applied, so a large die can be employed as the lower die 21. However, in a large die, degree of resin solidification in a cavity space is partially different. In the case of regarding the lower die as a large cavity, preferably the resin solidification begins from a center part of the lower die 21 and gradually advanced toward an outer edge. With this solidification, air in the resin can be introduced outside of the cavity space and forming voids in the molded product can be prevented. To begin the resin solidification from the center part of the lower die 21, heat capacity of the center part of the die is greater than that of the outer edge part, or carolific power of the heaters in the center part of the die is greater than that of the heaters in the outer edge part. Note that, heat distribution of the die can be uniform by forming the die into a circular shape.

Figure 20:
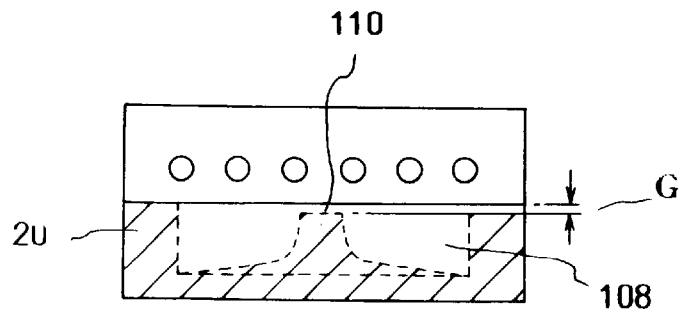
FIG. 20 is a partial sectional view showing an inner structure of an upper die.

In FIG. 20, heat insulating spaces 108 are formed in the upper die 20 so as to control distribution of the heat capacity in the upper die 20.

Resin shrinks during solidification, so the center part of the die may be overfilled so as to make the molded product have predetermined thickness after solidification. When the resin is filled in the cavity space (not shown) in the lower die (not shown) with proper resin pressure, the center part of the bottom parting face of the upper die is pushed upward and slightly deformed. After the resin is solidified, the deformed center part of the upper die 20 returns to the initial state. In FIG. 20, there is a small gap "G", e.g., 0.02 mm, is formed in the upper die 20. By the small gap "G", the upper die 20 can be slightly deformed by the resin pressure.

As described in the embodiments, the main characteristic point of the resin molding machine of the present invention is using the release film. By using the release film, the resin in each cavity space is properly pressurized by air pressure of the air left in the cavity space and the elasticity of the release film.

Figure 21:
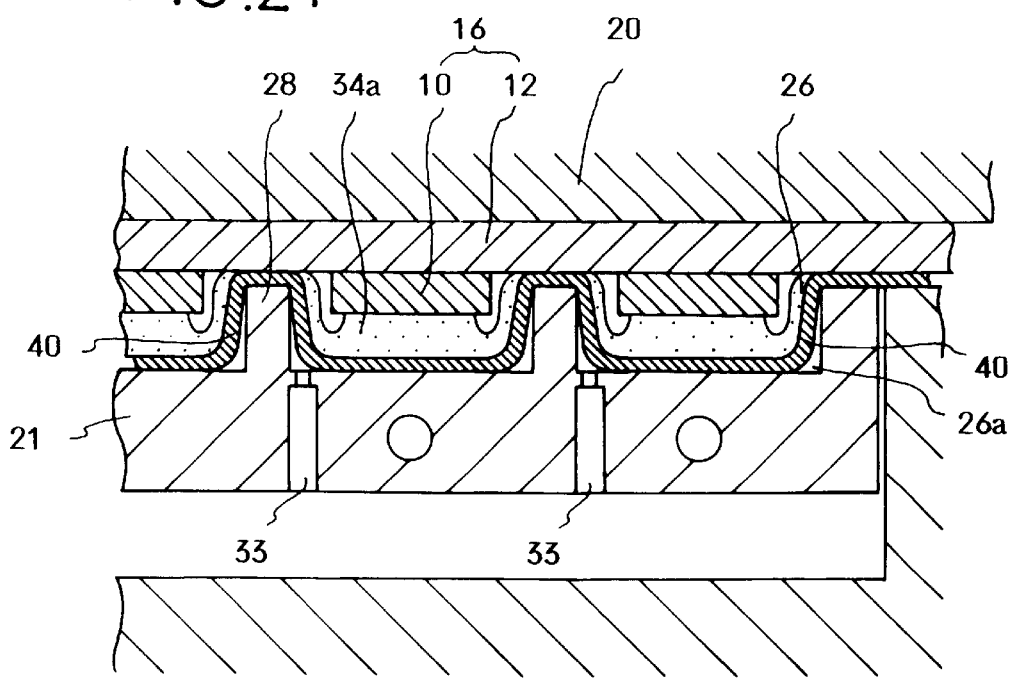
FIG. 21 is a sectional view of cavities in which resin is filled.

FIG. 21 shows a state in which the member 16 to be molded is clamped by the upper die 20 and the lower die 21 together with the release film 40. Since the cavities 26a are respectively divided by the parting sections 28, the air sealed up in each cavity 26a is compressed by clamping the member 16 together with the release film 40. The air sealed up in the cavity 26 and the release film 40 press the resin 34a or 50. This pressing action applies proper pressure to the resin in the cavity space when the resin is solidified and its volume is reduced.

In the embodiment shown in FIG. 21, air paths 33 are formed in the lower die 21 and opened in the inner bottom faces of the cavities 26a, and compressed air is sent through the air paths 33 so as to apply pressure. The air pressure may be applied through the air sucking holes 32, which are opened in the inner bottom faces of the cavities 26a so as to fix the release film thereon, instead of the air paths 33.

Figure 22:
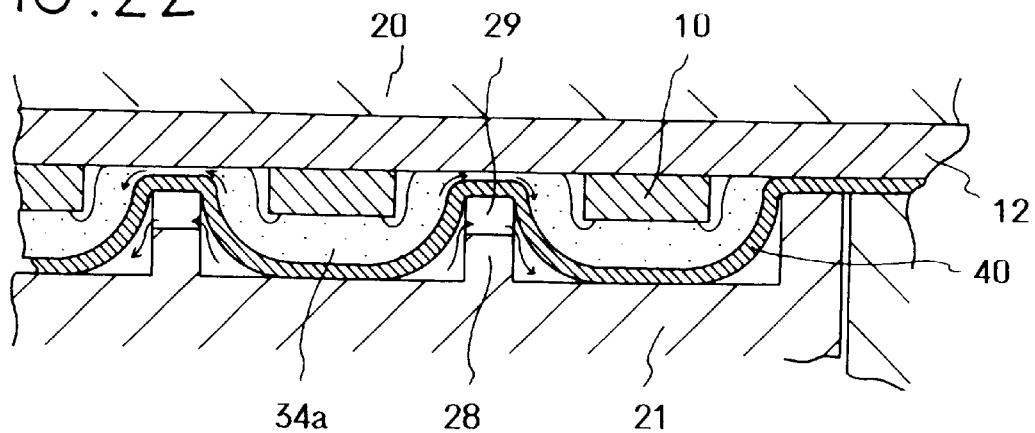
FIG. 22 is a sectional view showing runner paths.
Figure 23:
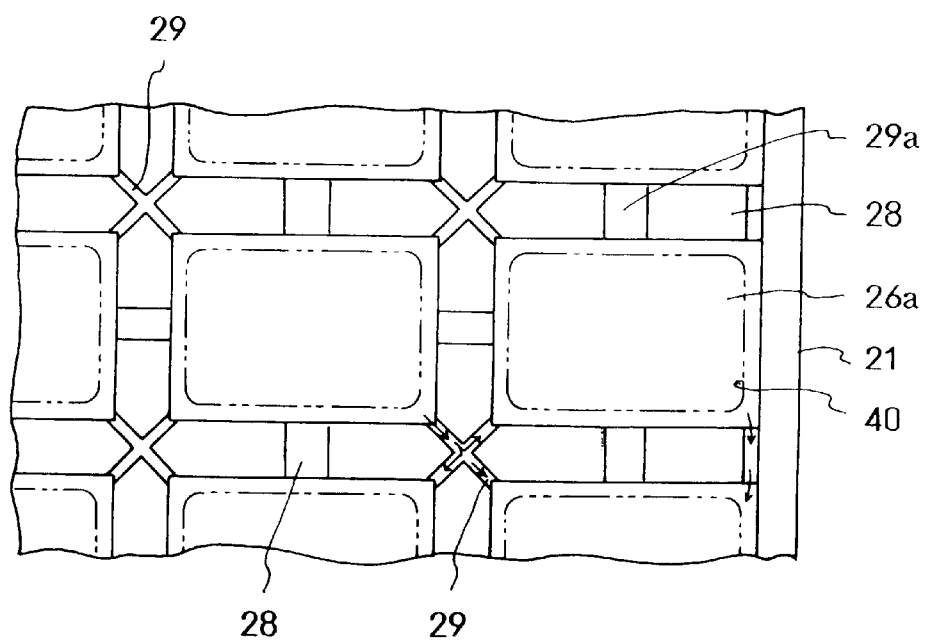
FIG. 23 is a plan view showing the runner paths.
Figure 24:
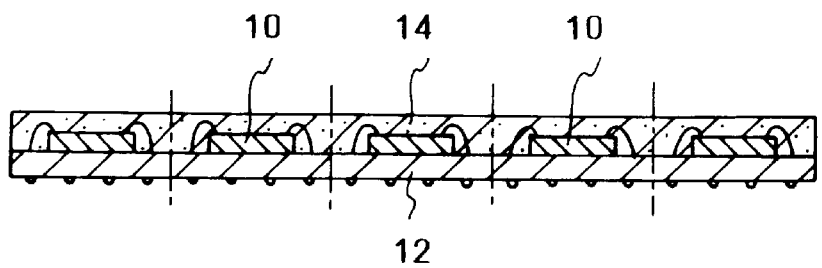
FIG. 24 is a sectional view of a molded product, in which semiconductor chips are mounted on a substrate and molded with resin.

In a molding die shown in FIGS. 22 and 23, runner paths 29 and 29a are formed in the parting sections 28 for dividing the cavities 26a. In the present embodiment, each runner path 29a, which communicates the adjacent cavities 26a, is formed in a mid portion of the parting section 28, which is formed between the adjacent cavities 26a; each runner path 29, which diagonally communicates the cavities 26a, is formed in a cross portion of the parting sections 28. By forming the runner paths, the air left can be introduced from one cavity space 26 to others and the resin pressure in the cavity spaces 26 can be balanced. Further, the runner path is capable of making amount of the resin in the cavity spaces 26 equal as well as the runner paths 30 of the above described embodiment.

The method of the present invention can be applied to mold many kinds of members to be molded, e.g., a substrate on which semiconductor chips are mounted, a circuit module including a plastic substrate and circuits elements mounted thereon, a semiconductor wafer, a semiconductor wafer on which electric terminals or circuits are formed. The substrate may be a multi-layered substrate, a tape substrate, etc.

In the above described embodiments, the release film is formed like long sheet and wound on the feeding roll, but strip-formed release film may be used.

If the sizes of the dies are limited to specific sizes, e.g., A3, A4, A5, the resin molding machine can be commonly and efficiently used.

The parting faces, which include the molding sections, of the upper die 20 and the lower die 21 may be coated with nickel-boron-tungsten alloy by electroless plating. Resin is easily peelable from the coated faces, and resin leakage can be prevented. Further, the parting faces may be coated with a silicic material, fluoric resin or dispersion coating dispersed with oligomer so as to effectively prevent the resin leakage because a moving range of resin in molding dies, one of which is moved to mold.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of manufacturing semiconductor devices in a molding machine including an upper die and a lower die, in one of which a plurality of cavities corresponding to resin-molded parts of the semiconductor devices are matrically arranged, the method comprising the steps of:

covering inner faces of said cavities and a parting face of one of said dies, which contacts a substrate of the semiconductor devices, with release film, which is easily peelable from said dies and resin for molding, said release film being fixed on the inner faces of said cavities by sucking air through air sucking holes, which are respectively opened in the inner faces of said cavities, when the inner faces of said cavities and the parting face of said die are covered with said release film;

clamping the substrate with said dies;

filling the resin in said cavities; and forming the semiconductor devices by cutting the molded substrate.

2. The method according to claim 1, wherein said cavities are formed in a molding face of said die and divided by a parting section whose end face acts as a part of the parting face, wherein a resin path is formed in said parting section so as to mutually communicate the adjacent cavities, and wherein the resin is pressurized in a pot and sent from the pot to said cavities.

3. A method of manufacturing semiconductor devices in a molding machine including an upper die and a lower die, the method comprising the steps of:

covering parts of parting faces of said dies, which clamp a semiconductor wafer having a plurality of pillars, with release film, which is easily peelable from said dies and resin for molding;

providing the resin onto one side face of said semiconductor wafer;

clamping the semiconductor wafer and pressing said release film onto end faces of the pillars of said semiconductor wafer by said dies;

molding the one side face of the semiconductor wafer with the resin; and forming the semiconductor devices by cutting the molded semiconductor wafer.

4. A resin molding machine, comprising:

an upper die and a lower die for clamping a member to be molded, which includes a substrate on which semiconductor chips and/or circuit elements are mounted;

a plurality of cavities being formed in one of said dies, said cavities being capable of accommodating the semiconductor chips and/or the circuit elements;

a release film feeding mechanism for feeding release film, which is easily peelable from said dies and resin for molding, so as to cover inner faces of said cavities and a parting face of one of said dies, which contacts the substrate; and a resin filling mechanism for sending the resin from a pot to said cavities while the member to be molded is clamped by said dies together with said release film, whereby the semiconductor chips and/or the circuit elements are respectively molded with resin.

5. A resin molding machine, comprising:

an upper die and a lower die for clamping a member to be molded, which includes a substrate on which semiconductor chips and/or circuit elements are mounted;

a plurality of cavities being formed in said lower die, said cavities being capable of accommodating the semiconductor chips and/or the circuit elements; and a release film feeding mechanism for feeding release film, which is easily peelable from said dies and resin for molding, so as to cover inner faces of said cavities and a parting face of said lower die, which contacts the substrate, wherein the member to be molded is clamped by said dies together with said release film and molded with the resin which is supplied into a space enclosed with said release film.

6. The resin molding machine according to claim 5, further comprising a damper being provided to said lower die, said damper being biased toward said upper die so as to project a clamping face from the parting face of said lower die when said dies are opened and capable of clamping an outer edge section of the member to be molded.

7. A resin molding machine for molding a whole one side face of a semiconductor wafer, comprising:

an upper die and a lower die for clamping a semiconductor wafer;

a molding section being formed in a parting face of one of said dies; and a release film feeding mechanism for feeding release film, which is easily peelable from said dies and resin for molding, so as to cover the parting faces of said dies, wherein the semiconductor wafer is clamped by said dies together with said release film and molded with the resin which is supplied into said molding section.

8. The resin molding machine according to claim 4, further comprising:

an overflow cavity being formed in the parting face of said die; and an air path being opened in a bottom face of said overflow cavity and connected to an air mechanism.

9. The resin molding machine according to claim 4, wherein said dies are designed to solidify the resin from a center part of a molding section to an outer edge part thereof.

10. The resin molding machine according to claim 4, wherein a part of the parting face, to which said release film is pressed, is formed into a rough surface.

11. A method of manufacturing semiconductor devices in a molding machine including an upper die and a lower die, in one of which a plurality of cavities corresponding to resin-molded parts of the semiconductor devices are formed, wherein said cavities are formed in a molding face of said die and divided by a parting plate, which is provided in said die and which is capable of moving in an open-close direction of said dies, the method comprising the steps of:

covering inner faces of said cavities and a parting face of one of said dies, which contacts a substrate of the semiconductor devices, with release film, which is easily peelable from said dies and resin for molding;

clamping the substrate with said dies;

filling said cavities with resin while an end face of said parting plate is positioned away from a surface of the substrate;

pressing the end face of said parting plate onto the surface of the substrate after the cavities are filled with resin; and forming the semiconductor devices by cutting the molded substrate.

12. A method of manufacturing semiconductor devices in a molding machine including an upper die and a lower die, at least one of the dies being mounted for open-close movement relative to the other die along a path inclined to the vertical, a plurality of cavities corresponding to resin-molded parts of the semiconductor devices being formed in a molding face of said lower die and divided by a parting section whose end face acts as a part of the parting face, the method comprising the steps of:

while said dies are opened, covering inner faces of said cavities and a parting face of said lower die, which contacts a substrate of the semiconductor devices, with release film, which is easily peelable from said dies and resin for molding;

clamping the substrate, together with said release film, between said upper die and said lower die, whereby resin-molded parts divided by said parting section are respectively molded with the resin;

providing a supply of resin having sufficient volume to fill said cavities;

filling the cavities with the resin; and forming the semiconductor devices by cutting the molded substrate.

13. The method according to claim 12, wherein a resin supplying section is provided to one of said dies, and the resin is supplied into a space enclosed with said release film.

* * * * *